United States Patent
Kashiwaya et al.

(10) Patent No.: US 7,309,949 B2
(45) Date of Patent: Dec. 18, 2007

(54) PIEZOELECTRIC/ELECTROSTRICTIVE PORCELAIN COMPOSITION, PIEZOELECTRIC/ELECTROSTRICTIVE CERAMIC AND PIEZOELECTRIC/ELECTROSTRICTIVE FILM TYPE DEVICE

(75) Inventors: Toshikatsu Kashiwaya, Inazawa (JP); Yukihisa Takeuchi, Nishikamo-gun (JP); Yuya Kikuta, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 376 days.

(21) Appl. No.: 11/064,070

(22) Filed: Feb. 23, 2005

(65) Prior Publication Data

US 2005/0194868 A1    Sep. 8, 2005

(30) Foreign Application Priority Data

Mar. 3, 2004    (JP)    ............................... 2004-058990

(51) Int. Cl.
*H01L 41/187*    (2006.01)

(52) U.S. Cl. ............... 310/358; 501/134; 252/62.9 PZ; 252/62.9 R; 257/347

(58) Field of Classification Search ............ 347/68–72; 310/358; 501/134; 252/62.9 R, 62.9 PZ; 257/347

See application file for complete search history.

(56) References Cited

U.S. PATENT DOCUMENTS 4,027,209 A * 5/1977 Maher ..................... 361/321.4
4,219,866 A     8/1980 Maher

FOREIGN PATENT DOCUMENTS

| DE | 44 16 246 | 11/1995 |
|----|-----------|---------|
| EP | 0 539 151 | 4/1993 |
| EP | 1 321 987 | 6/2003 |
| GB | 2 161 647 | 1/1986 |
| JP | 44-17103  | 7/1969 |
| JP | 45-8145   | 3/1970 |
| JP | 54-4077   | 3/1979 |
| JP | 54-118564 | 9/1979 |
| JP | 58-194758 | 11/1983 |
| JP | 01-100052 | 4/1989 |
| JP | 05-114308 | 5/1993 |

* cited by examiner

*Primary Examiner*—J. San Martin
(74) *Attorney, Agent, or Firm*—Burr & Brown

(57) ABSTRACT

A piezoelectric/electrostrictive porcelain composition capable of being manufactured at a comparatively low firing temperature is provided, as well as a piezoelectric/electrostrictive ceramic or a piezoelectric/electrostrictive portion which is dense and superior in crystallinity and which has superior piezoelectric/electrostrictive characteristics and durability even under high temperature and high humidity conditions. The piezoelectric/electrostrictive porcelain composition includes a piezoelectric/electrostrictive component containing lead titanate zirconate, and 0.5 to 5% by mass of glass component containing 8% by mass or less of silicic acid.

32 Claims, 6 Drawing Sheets

PIEZOELECTRIC/ELECTROSTRICTIVE PORCELAIN COMPOSITION, PIEZOELECTRIC/ELECTROSTRICTIVE CERAMIC AND PIEZOELECTRIC/ELECTROSTRICTIVE FILM TYPE DEVICE

BACKGROUND OF THE INVENTION

1. Field of the Invention

The present invention relates to a piezoelectric/electrostrictive porcelain composition, a piezoelectric/electrostrictive ceramic, and a piezoelectric/electrostrictive film type device. In more detail, the present invention relates to a piezoelectric/electrostrictive porcelain composition capable of manufacturing even at a comparatively low firing temperature a piezoelectric/electrostrictive ceramic or a piezoelectric/electrostrictive portion which is dense, superior in crystallinity, and has superior piezoelectric/electrostrictive characteristic and durability even under conditions of high temperature with high humidity. Furthermore, the present invention relates to a piezoelectric/electrostrictive ceramic which is dense, superior in crystallinity, and has superior piezoelectric/electrostrictive characteristic and durability even under conditions of high temperature with high humidity. The present invention also relates to a piezoelectric/electrostrictive device which is dense, superior in crystallinity, and has superior piezoelectric/electrostrictive characteristic and durability even under conditions of high temperature with high humidity.

2. Description of the Related Art

Piezoelectric/electrostrictive devices have heretofore been known as devices capable of controlling minute displacements in a submicron order. Especially, a piezoelectric/electrostrictive film type device comprising: a piezoelectric/electrostrictive portion made of a piezoelectric/electrostrictive porcelain composition; and an electrode portion to which a voltage is applied, laminated on a substrate constituted of a ceramic is suitable for the control of the minute displacement, and further has superior characteristics such as high electromechanical conversion efficiency, high-speed response, high durability, and low power consumption. These piezoelectric/electrostrictive devices are used in various applications such as piezoelectric pressure sensor, prove-transferring mechanism in scanning tunnel microscope, rectilinear guide mechanism in ultra-precision processing apparatus, servo valve for hydraulic control, head of VTR device, pixel constituting flat panel type image display device, and head of ink jet printer, and the like.

Moreover, the piezoelectric/electrostrictive porcelain composition constituting the piezoelectric/electrostrictive portion has also been various studied. For example, a $Pb(Mg_{1/3}Nb_{2/3})O_3$—$PbTiO_3$—$PbZrO_3$ ternary system solid solution composition, or a piezoelectric/electrostrictive porcelain composition in which a part of Pb of the composition is substituted with Sr, La or the like has been described (see, e.g., JPB-44-17103 and JP-B-45-8145). It has been expected that a piezoelectric/electrostrictive device having a superior piezoelectric/electrostrictive characteristic (e.g., a piezoelectric d constant) is obtained from the piezoelectric/electrostrictive portion which is a most important portion for determining the piezoelectric/electrostrictive characteristic of the piezoelectric/electrostrictive device.

However, in a conventional piezoelectric/electrostrictive device, when a high electric field is applied on severe use conditions such as a high-temperature condition at 35° C. or more after installation, or a high-humidity condition at 80% RH or more, micro cracks are sometimes generated in the piezoelectric/electrostrictive portion. Therefore, especially when the number of repeating times of the application of the high electric field is large, the characteristic of a piezoelectric/electrostrictive material lowers in some case, and there has been a problem in durability.

On the other hand, when the piezoelectric/electrostrictive portion of the piezoelectric/electrostrictive device is constituted in such a manner as to be denser, superior in crystallinity, and indicate a high piezoelectric/electrostrictive characteristic, the piezoelectric/electrostrictive material (e.g., PZT-based composition) which is a raw material needs to be, fired at 1200° C. or more. Therefore, in addition to a problem that energy costs are high, there have been problems that it is difficult to use an Ag electrode or an Ag—Pd electrode having a comparatively low melting point, an electrode containing expensive Pt has to be used in many cases, and versatility is insufficient.

To solve the problems, there have been made some attempts to add glasses such as lead borosilicate glass, silicate glass, and borosilicate glass to the piezoelectric/electrostrictive material, and form and densify the piezoelectric/electrostrictive portion or a piezoelectric/electrostrictive ceramic at a lower firing temperature (see, e.g., Japanese Patent No. 3236641 and BP-A-2161647). However, in pursuit of the firing at the low temperature, there are problems that the piezoelectric/electrostrictive characteristic largely drops because a glass amount is large. The durability of the piezoelectric/electrostrictive ceramic or the like has not been evaluated in the present situations. Since the glass and the piezoelectric/electrostrictive material have high reactivity, there have been problems that the obtained piezoelectric/electrostrictive portion or piezoelectric/electrostrictive ceramic does not necessarily have desired composition, and the piezoelectric/electrostrictive characteristic drops.

SUMMARY OF THE INVENTION

The present invention has been developed in view of the problems of the conventional techniques, and an object thereof is to provide a piezoelectric/electrostrictive porcelain composition capable of manufacturing even at a comparatively low firing temperature a piezoelectric/electrostrictive ceramic or a piezoelectric/electrostrictive portion which is dense and which is superior in crystallinity and which has superior piezoelectric/electrostrictive characteristic and durability even under high temperature with high humidity conditions. Furthermore, an object of the present invention is to provide a piezoelectric/electrostrictive ceramic which is dense and which is superior in crystallinity and which has superior piezoelectric/electrostrictive characteristic and durability even under high temperature with high humidity conditions.

Another object of the present invention is to provide a piezoelectric/electrostrictive device comprising a piezoelectric/electrostrictive portion which is dense and which is superior in crystallinity and which has superior piezoelectric/electrostrictive characteristic and durability even under high temperature with high humidity conditions.

As a result of intensive research, the present inventors have found that a predetermined amount of glass component whose $SiO_2$ content is controlled into a predetermined amount is contained in a piezoelectric/electrostrictive porcelain composition constituting a piezoelectric/electrostrictive ceramic or a piezoelectric/electrostrictive portion, and accordingly the problems can be solved, and have completed the present invention. That is, according to the present invention, there are provided the following piezoelectric/electrostrictive porcelain composition, a piezoelectric/electrostrictive ceramic, and a piezoelectric/electrostrictive film type device.

According to a first aspect of the present invention, a piezoelectric/electrostrictive porcelain composition is provided, comprising a piezoelectric/electrostrictive component containing lead titanate zirconate, and 0.5 to 5% by mass of glass component containing 8% by mass or less of $SiO_2$.

According to a second aspect, in the piezoelectric/electrostrictive porcelain composition according to the first aspect, the piezoelectric/electrostrictive component is mainly composed of a $Pb(Mg_{1/3}Nb_{2/3})O_3$—$PbTiO_3$—$PbZrO_3$ ternary system solid solution composition.

According to a third aspect, in the piezoelectric/electrostrictive porcelain composition according to the above aspects, the glass component is mainly composed of ZnO—PbO—$B_2O_3$-based glass.

According to a fourth aspect of the present invention, in the piezoelectric/electrostrictive porcelain composition according to the second or third aspects, the $Pb(Mg_{1/3}Nb_{2/3})O_3$—$PbTiO_3$—$PbZrO_3$ ternary system solid solution composition is represented by the following composition formula (1): $Pb_x(Mg_{1/3}Nb_{2/3})_aTi_bZr_cO_3$     (1)

wherein $0.90 \leq x \leq 1.10$, and a, b, c denote decimals in a range surrounded with (a, b, c)=(0.550, 0.425, 0.025), (0.550, 0.325, 0.125), (0.375, 0.325, 0.300), (0.100, 0.425, 0.475), (0.100, 0.475, 0.425), (0.375, 0.425, 0.200) in a coordinate including the above a, b, c as coordinate axes (additionally, a+b+c=1.000).

According to a fifth aspect, in the piezoelectric/electrostrictive porcelain composition according to the fourth aspect, x in the composition formula (1) is in a range of $0.95 \leq x \leq 1.05$.

According to a sixth aspect, in the piezoelectric/electrostrictive porcelain composition according to any one of the above second to fifth aspects, a part of Pb of the $Pb(Mg_{1/3}Nb_{2/3})O_3$—$PbTiO_3$—$PbZrO_3$ ternary system solid solution composition is substituted with Sr and/or La.

According to a seventh aspect, in the piezoelectric/electrostrictive porcelain composition according to the sixth aspect, 3.0 to 10.0 mol % of Pb of the $Pb(Mg_{1/3}Nb_{2/3})O_3$—$PbTiO_3$—$PbZrO_3$ ternary system solid solution composition is substituted with Sr.

According to an eighth aspect, in the piezoelectric/electrostrictive porcelain composition according to the sixth or seventh aspects, 0.3 to 5.0 mol % of Pb of the $Pb(Mg_{1/3}Nb_{2/3})O_3$—$PbTiO_3$—$PbZrO_3$ ternary system solid solution composition is substituted with La.

According to a ninth aspect, in the piezoelectric/electrostrictive porcelain composition according to any one of the above second to eighth aspects, 0.05 to 2.0% by mass in total of oxide of at least one metal element selected from a group consisting of Ni, Ce, Pr, Nd, Sm, Eu, Gd, Tb, Dy, Ho, Er, Tm, and Yb is added to the $Pb(Mg_{1/3}Nb_{2/3})O_3$—$PbTiO_3$—$PbZrO_3$ ternary system solid solution composition.

According to a tenth aspect, in the piezoelectric/electrostrictive porcelain composition according to any one of the above third to ninth aspects, a composition of the ZnO—PbO—$B_2O_3$-based glass is represented by the following composition formula (2):

d mass % ZnO-e mass % PbO-f mass % $B_2O_3$     (2),

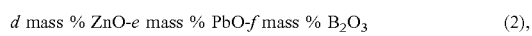

wherein $30 \leq d \leq 70$, $15 \leq e \leq 45$, $10 \leq f \leq 30$.

According to an eleventh aspect, in the piezoelectric/electrostrictive porcelain composition according to any one of the first through tenth aspects, at least a part of the surface of the piezoelectric/electrostrictive component comprises particles coated with the glass component.

According to a twelfth aspect, in the piezoelectric/electrostrictive porcelain composition according to any one of the first through tenth aspects, both the piezoelectric/electrostrictive component and the glass component comprise particles, and an average particle diameter of the glass component is smaller than that of an average particle diameter of the piezoelectric/electrostrictive component.

According to a thirteenth aspect, in the piezoelectric/electrostrictive porcelain composition according to the first aspect, the piezoelectric/electrostrictive component is mainly composed of a $Pb(Mg, Ni)_{1/3}Nb_{2/3}O_3$—$PbTiO_3$—$PbZrO_3$ ternary system solid solution composition.

According to a fourteenth aspect, in the piezoelectric/electrostrictive porcelain composition according to the thirteenth aspect, the glass component is mainly composed of ZnO—PbO—$B_2O_3$-based glass.

According to a fifteenth aspect, in the piezoelectric/electrostrictive porcelain composition according to the above thirteenth or fourteenth aspects, the $Pb(Mg, Ni)_{1/3}Nb_{2/3}O_3$—$PbTiO_3$—$PbZrO_3$ ternary system solid solution composition is represented by the following composition formula (3):

$Pb_x\{(Mg_{1-y}Ni_y)_{(1/3)}{}_aNb_{2/3}\}_bTi_cZr_dO_3$     (3),

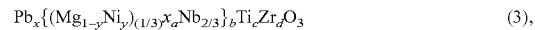

wherein $0.90 \leq x \leq 1.10$, $0.05 \leq y \leq 0.20$, $0.90 \leq a \leq 1.10$, and b, c, d denote decimals in a range surrounded with (b, c, d)=(0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in a coordinate including the above b, c, d as coordinate axes (additionally, (b+c+d)=1.000).

According to a sixteenth aspect, in the piezoelectric/electrostrictive porcelain composition according to the fifteenth aspect, x in the composition formula (3) is in a range of $0.95 \leq x \leq 1.05$.

According to a seventeenth aspect, in the piezoelectric/electrostrictive porcelain composition according to any one of the above thirteenth to sixteenth aspects, a part of Pb of the $Pb(Mg, Ni)_{1/3}Nb_{2/3}O_3$—$PbTiO_3$—$PbZrO_3$ ternary system solid solution composition is substituted with Sr and/or La.

According to an eighteenth aspect, in the piezoelectric/electrostrictive porcelain composition according to the seventeenth aspect, 3.0 to 10.0 mol % of Pb of the $Pb(Mg, Ni)_{1/3}Nb_{2/3}O_3$—$PbTiO_3$—$PbZrO_3$ ternary system solid solution composition is substituted with Sr.

According to a nineteenth aspect, in the piezoelectric/electrostrictive porcelain composition according to the above seventeenth or eighteenth aspect, 0.3 to 5.0 mol % of Pb of the $Pb(Mg, Ni)_{1/3}Nb_{2/3}O_3$—$PbTiO_3$—$PbZrO_3$ ternary system solid solution composition is substituted with La.

According to a twentieth aspect, in the piezoelectric/electrostrictive porcelain composition according to any one of the above thirteenth to nineteenth aspects, 0.05 to 2.0% by mass in total of oxide of at least one metal element selected from a group consisting of Ce, Pr, Nd, Sm, Eu, Gd, Tb, Dy, Ho, Er, Tm, and Yb is added to the $Pb(Mg, Ni)_{1/3}Nb_{2/3}O_3$—$PbTiO_3$—$PbZrO_3$ ternary system solid solution composition.

According to a twenty-first aspect, in the piezoelectric/electrostrictive porcelain composition according to any one of the above fourteenth to twentieth aspects, a composition of the ZnO—PbO—$B_2O_3$-based glass is represented by the following composition formula (4):

$$d \text{ mass } \% \text{ ZnO-}e \text{ mass } \% \text{ PbO-}f \text{ mass } \% \text{ } B_2O_3 \tag{4},$$

wherein $30 \leq d \leq 70$, $15 \leq e \leq 45$, $10 \leq f \leq 30$.

According to a twenty-second aspect, in the piezoelectric/electrostrictive porcelain composition according to any one of the above thirteenth to twenty-first aspects, at least a part of the surface of the piezoelectric/electrostrictive component comprises particles coated with the glass component.

According to a twenty-third aspect, in the piezoelectric/electrostrictive porcelain composition according to any one of the above thirteenth to twenty-first aspects, both the piezoelectric/electrostrictive component and the glass component comprise particles, and an average particle diameter of the glass component is smaller than that of an average particle diameter constituted of the piezoelectric/electrostrictive component.

According to a twenty-fourth aspect of the present invention, a piezoelectric/electrostrictive ceramic is provided comprising grains constituted of the piezoelectric/electrostrictive porcelain composition according to any one of the above first to tenth and thirteenth to twenty-first aspects.

According to a twenty-fifth aspect, in the piezoelectric/electrostrictive ceramic according to the twenty-fourth aspect, an average diameter of the crystal grains is in a range of 0.3 to 5 μm.

According to a twenty-sixth aspect, the piezoelectric/electrostrictive ceramic according to the above twenty-fourth or twenty-fifth aspects has a whole shape which is a sheet shape.

According to a twenty-seventh aspect of the present invention, a piezoelectric/electrostrictive film type device is provided comprising a ceramic substrate, a film-like piezoelectric/electrostrictive portion, and a film-like electrode electrically connected to the piezoelectric/electrostrictive portion. The piezoelectric/electrostrictive portion is a piezoelectric/electrostrictive film type device bonded onto the substrate directly or via the electrode, and the piezoelectric/electrostrictive portion comprises the piezoelectric/electrostrictive porcelain composition according to any one of the above first to tenth and thirteenth to twenty-first aspects.

According to a twenty-eighth aspect, in the piezoelectric/electrostrictive film type device according to the twenty-seventh aspect, an average diameter of crystal grains in the piezoelectric/electrostrictive composition is in a range of 0.3 to 5 μm.

According to a twenty-ninth aspect, a piezoelectric/electrostrictive film type device according to the above twenty-seventh or twenty-eighth aspects in provided, comprising a plurality of piezoelectric/electrostrictive portions and a plurality of electrodes. The plurality of piezoelectric/electrostrictive portions are alternately laminated to be sandwiched by the plurality of electrodes.

According to a thirtieth aspect, in the piezoelectric/electrostrictive film type device according to any one of the above twenty-seventh to twenty-ninth aspects, a thickness of one of the piezoelectric/electrostrictive portions is in a range of 0.5 to 50 μm.

The piezoelectric/electrostrictive porcelain composition of the present invention includes a piezoelectric/electrostrictive component containing lead titanate zirconate and 0.5 to 5% by mass of glass component containing 8% by mass or less of $SiO_2$. Therefore, an effect is produced that a piezoelectric/electrostrictive ceramic or a piezoelectric/electrostrictive portion being dense and superior in crystallinity and having superior piezoelectric/electrostrictive characteristic and durability even under high temperature with high humidity conditions can be manufactured even at a comparatively low firing temperature.

Moreover, since the piezoelectric/electrostrictive ceramic of the present invention comprises crystal grains constituted of the piezoelectric/electrostrictive porcelain composition, an effect is produced that the ceramic is dense and superior in crystallinity, and has superior piezoelectric/electrostrictive characteristic and durability even under the high temperature with high humidity conditions.

Since the piezoelectric/electrostrictive portion of the piezoelectric/electrostrictive film type device of the present invention comprises crystal grains constituted of the piezoelectric/electrostrictive porcelain composition, an effect is produced that the device is dense and superior in crystallinity, and has superior piezoelectric/electrostrictive characteristic and durability even under the high temperature with high humidity conditions.

BRIEF DESCRIPTION OF THE DRAWINGS

FIG. 5(*b*) is a sectional view schematically showing still another embodiment of the piezoelectric/electrostrictive device made of the piezoelectric/electrostrictive film according to the present invention.

FIG. 12(*b*) is a top plan view of the embodiment shown in FIG. 6.

DESCRIPTION OF THE INVENTION

Figure 1:
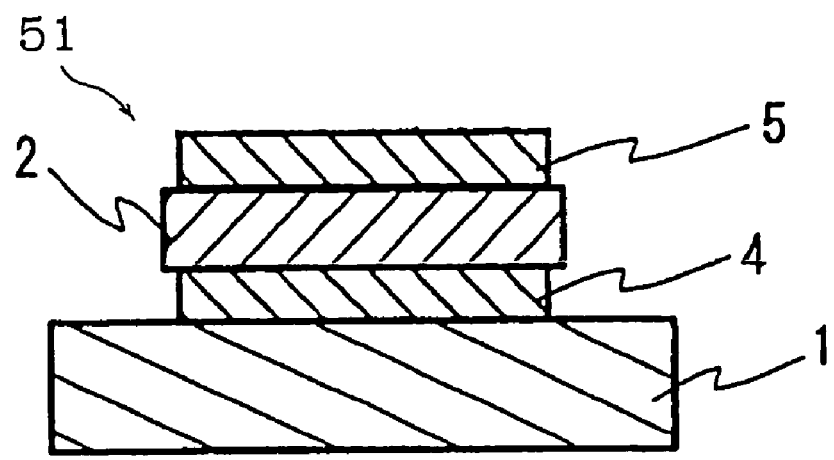
FIG. 1 is a sectional view schematically showing one embodiment of a piezoelectric/electrostrictive device made of a piezoelectric/electrostrictive film according to the present invention.

Modes for carrying out the present invention will be described hereinafter, but it should be understood that the present invention is not limited to the following embodiment, and can appropriately be changed, modified, or improved in change based on usual knowledge of a person skilled in the art without departing from the scope of the present invention.

In one embodiment of a piezoelectric/electrostrictive porcelain composition of the present invention, a piezoelectric/electrostrictive porcelain composition includes: a piezoelectric/electrostrictive component containing lead titanate zirconate; and 0.5 to 5% by mass of glass component containing 8% by mass or less of $SiO_2$. Characteristics of the piezoelectric/electrostrictive porcelain composition of the present embodiment lie in that a predetermined amount of a specific glass component whose content of $SiO_2$ has been controlled into a predetermined range is contained. Therefore, by the use of the piezoelectric/electrostrictive porcelain composition of the present embodiment, a piezoelectric/electrostrictive ceramic or a piezoelectric/electrostrictive portion which is dense and superior in crystallinity even at a low firing temperature can be formed. This characteristic is supposed to be exerted for forming a dense sintered body (piezoelectric/electrostrictive ceramic, piezoelectric/electrostrictive portion). At the firing time of the piezoelectric/electrostrictive ceramic or the piezoelectric/electrostrictive portion, the glass component whose viscosity has dropped penetrates into piezoelectric/electrostrictive crystal particles by capillary phenomenon, and gaps between the crystal particles are narrowed by surface tension. Furthermore, the characteristic is supposed to be exerted due to the formation of a sintered body (piezoelectric/electrostrictive ceramic, piezoelectric/electrostrictive portion) superior in crystallinity since adjacent crystal particles can grow without inhibiting mutual grain growth because of the presence of a low melting point glass layer constituting a liquid phase among the piezoelectric/electrostrictive crystal grains.

Durability of the piezoelectric/electrostrictive ceramic or the piezoelectric/electrostrictive device formed by firing the piezoelectric/electrostrictive porcelain composition drops by the repeated use under high temperature and high humidity conditions. It is supposed that this phenomenon is usually caused when a large number of micro pores exist in a grain boundary constituting the piezoelectric/electrostrictive ceramic or the piezoelectric/electrostrictive portion, and micro cracks are generated because of invasion of water content through these pores.

However, by the use of the piezoelectric/electrostrictive porcelain composition of the present embodiment, it is possible to form the piezoelectric/electrostrictive ceramic or the piezoelectric/electrostrictive portion in which a glass layer exists in a grain boundary. Therefore, moisture does not easily penetrate into the pores, and the micro cracks are not easily generated. The piezoelectric/electrostrictive ceramic or the piezoelectric/electrostrictive portion having superior piezoelectric/electrostrictive characteristic and durability even under high temperature with high humidity conditions can be obtained. The specific glass component whose $SiO_2$ content is controlled into a predetermined range is contained, and therefore the piezoelectric/electrostrictive ceramic or the piezoelectric/electrostrictive portion which is dense can be formed even at a comparatively low firing temperature. Therefore, since an Ag electrode or an Ag—Pd electrode having a lower melting point as compared with a Pt electrode can be positively used, energy costs are reduced, and versatility is superior.

In the piezoelectric/electrostrictive porcelain composition of the present embodiment, the contained piezoelectric/electrostrictive component is preferably mainly composed of a $Pb(Mg_{1/3}Nb_{2/3})O_3$—$PbTiO_3$—$PbZrO_3$ ternary system solid solution composition. Here, in the present specification, "mainly composed" in "mainly composed of the $Pb(Mg_{1/3}Nb_{2/3})O_3$—$PbTiO_3$—$PbZrO_3$ ternary system solid solution composition" means that a ratio of the $Pb(Mg_{1/3}Nb_{2/3})O_3$—$PbTiO_3$—$PbZrO_3$ ternary system solid solution composition with respect to the whole piezoelectric/electrostrictive component is 99.5% by mass or more, preferably 99.8% by mass or more.

Moreover, in the piezoelectric/electrostrictive porcelain composition of the present embodiment, the contained glass component is preferably mainly composed of ZnO—PbO—$B_2O_3$-based glass. Since the glass component mainly composed of the ZnO—PbO—$B_2O_3$-based glass has poor reactivity with lead titanate zirconate contained in the piezoelectric/electrostrictive component, the composition of the obtained piezoelectric/electrostrictive portion or piezoelectric/electrostrictive ceramic does not easily shift from a desired composition, and the piezoelectric/electrostrictive ceramic or the piezoelectric/electrostrictive portion exhibiting further superior piezoelectric/electrostrictive characteristic can be formed. Here, in the present specification, "mainly composed" in "mainly composed of the ZnO—PbO—$B_2O_3$-based glass" means that a ratio of the ZnO—PbO—$B_2O_3$-based glass with respect to the whole glass component is 85% by mass or more, preferably 92% by mass or more.

Furthermore, the composition of the ZnO—PbO—$B_2O_3$-based glass is preferably represented by the following composition formula (5), so that the piezoelectric/electrostrictive ceramic or the piezoelectric/electrostrictive portion being more dense and superior in crystallinity and having further superior piezoelectric/electrostrictive characteristic and durability under high temperature with high humidity conditions can be obtained:

$$d \text{ mass \% ZnO-} e \text{ mass \% PbO-} f \text{ mass \% } B_2O_3 \quad (5),$$

wherein, in the above composition formula (5), $30 \leq d \leq 70$, $15 \leq e \leq 45$, $10 \leq f \leq 30$.

It is to be noted that a range of a value of d in the above composition formula (5) is further preferably $35 \leq d \leq 60$, especially preferably $40 \leq d \leq 50$. Similarly, a range of a value of e is further preferably $20 \leq e \leq 40$, especially preferably $25 \leq e \leq 35$. A range of a value of f is further preferably $13 \leq f \leq 27$, especially preferably $15 \leq f \leq 25$.

Moreover, in the piezoelectric/electrostrictive porcelain composition of the present embodiment, the $Pb(Mg_{1/3}Nb_{2/3})O_3$—$PbTiO_3$—$PbZrO_3$ ternary system solid solution composition is preferably represented by the following composition formula (6) in that the piezoelectric/electrostrictive ceramic or the piezoelectric/electrostrictive portion having a higher piezoelectric/electrostrictive characteristic can be formed. It is to be noted that a range of x in the following composition formula (6) is further preferably $0.95 \leq x \leq 1.05$.

$$Pb_x(Mg_{1/3}Nb_{2/3})_a Ti_b Zr_c O_3 \quad (6),$$

wherein, in the above composition formula (6), $0.90 \leq x \leq 1.10$, and a, b, c denote decimals in a range surrounded with (a, b, c)=(0.550, 0.425, 0.025), (0.550, 0.325, 0.125), (0.375, 0.325, 0.300), (0.100, 0.425, 0.475), (0.100, 0.475, 0.425), (0.375, 0.425, 0.200) in a coordinate including the above a, b, c as coordinate axes (additionally, a+b+c=1.000).

On the other hand, in the piezoelectric/electrostrictive porcelain composition of the present embodiment, the contained piezoelectric/electrostrictive component is preferably mainly composed of a Pb(Mg, Ni)$_{1/3}$Nb$_{2/3}$O$_3$—PbTiO$_3$—PbZrO$_3$ ternary system solid solution composition. In this Pb(Mg, Ni)$_{1/3}$Nb$_{2/3}$O$_3$—PbTiO$_3$—PbZrO$_3$ ternary system solid solution composition, a part of Mg of the composition is substituted with Ni. Therefore, by the use of the piezoelectric/electrostrictive porcelain composition of the present embodiment containing the piezoelectric/electrostrictive component mainly composed of the dissolved composition, a hetero-phase in the piezoelectric/electrostrictive portion obtained by firing the composition can be inhibited from being formed. Therefore, a ratio occupied by a perovskite phase contributing to an electric field induced strain increases, and the piezoelectric/electrostrictive portion being dense and having a remarkably high piezoelectric/electrostrictive characteristic can be formed. Moreover, a small-sized and highly-characterized piezoelectric/electrostrictive film type device can be obtained. It is to be noted that in the present specification, "mainly composed" in "mainly composed of the Pb(Mg, Ni)$_{1/3}$Nb$_{2/3}$O$_3$—PbTiO$_3$—PbZrO$_3$ ternary system solid solution composition" means that a ratio of the Pb(Mg, Ni)$_{1/3}$Nb$_{2/3}$O$_3$—PbTiO$_3$—PbZrO$_3$ ternary system solid solution composition with respect to the whole piezoelectric/electrostrictive component is 99.5% by mass or more, preferably 99.8% by mass or more.

Moreover, in the piezoelectric/electrostrictive porcelain composition of the present embodiment, the Pb(Mg, Ni)$_{1/3}$Nb$_{2/3}$O$_3$—PbTiO$_3$—PbZrO$_3$ ternary system solid solution composition is preferably represented by the following composition formula (7) in that the piezoelectric/electrostrictive ceramic or the piezoelectric/electrostrictive portion having a higher piezoelectric/electrostrictive characteristic can be formed. It is to be noted that a range of x in the following composition formula (7) is further preferably $0.95 \leq x \leq 1.05$.

$$Pb_x\{(Mg_{1-y}Ni_y)_{(1/3)}x_aNb_{2/3}\}_bTi_cZr_dO_3 \qquad (7),$$

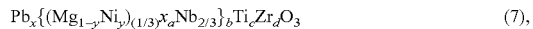

wherein, in the above composition formula (7), $0.90 \leq x \leq 1.10$, $0.05 \leq y \leq 0.20$, $0.90 \leq a \leq 1.1.0$, and b, c, d denote decimals in a range surrounded with (b, c, d)=(0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in a coordinate including the above b, c, d as coordinate axes (additionally, (b+c+d)=1.000).

The piezoelectric/electrostrictive porcelain composition according to the embodiment of the present invention preferably essentially comprises: the piezoelectric/electrostrictive component mainly composed of the Pb(Mg$_{1/3}$Nb$_{2/3}$)O$_3$—PbTiO$_3$—PbZrO$_3$ ternary system solid solution composition or the Pb(Mg, Ni)$_{1/3}$Nb$_{2/3}$O$_3$—PbTiO$_3$—PbZrO$_3$ ternary system solid solution composition; and the glass component mainly composed of ZnO—PbO—B$_2$O$_3$-based glass. It is to be noted that the content of the glass component in the piezoelectric/electrostrictive porcelain composition of the present embodiment is preferably 0.5 to 5% by mass. When the content of the glass component is less than 0.5% by mass, an effect of densification or the like is not sufficient in some case. On the other hand, when the content of the glass component exceeds 5% by mass, the densification is promoted. However, the piezoelectric/electrostrictive characteristic deteriorates in some case. From a viewpoint that the piezoelectric/electrostrictive ceramic or the piezoelectric/electrostrictive portion being dense and superior in crystallinity and having more superior piezoelectric/electrostrictive characteristic and durability even under high temperature with high humidity conditions be obtained, the content of the glass component is preferably 0.8 to 4.0% by mass, further preferably 1.0 to 3.0% by mass.

Moreover, in the piezoelectric/electrostrictive porcelain composition of the present embodiment, a part of Pb of the Pb(Mg$_{1/3}$Nb$_{2/3}$)O$_3$—PbTiO$_3$—PbZrO$_3$ ternary system solid solution composition, or a part of Pb of the Pb(Mg, Ni)$_{1/3}$Nb$_{2/3}$O$_3$—PbTiO$_3$—PbZrO$_3$ ternary system solid solution composition is preferably substituted with Sr and/or La, so that the piezoelectric/electrostrictive characteristic of the obtained piezoelectric/electrostrictive ceramic or piezoelectric/electrostrictive portion can be further enhanced.

However, when Pb is substituted with Sr and/or La at a high substitution ratio, the piezoelectric/electrostrictive characteristic of the obtained piezoelectric/electrostrictive ceramic or portion deteriorates, or a fluctuation of the piezoelectric/electrostrictive characteristic by a temperature change increases in some case. Therefore, when a part of Pb is substituted with Sr in the piezoelectric/electrostrictive porcelain composition of the present embodiment, 3.0 to 10.0 mol % of Pb is preferably substituted with Sr, and 5.0 to 8.5 mol % is further preferably substituted. When a part of Pb is substituted with La, 0.3 to 5.0 mol % of Pb is preferably substituted with La, and 0.5 to 3.0 mol % is further preferably substituted.

In the piezoelectric/electrostrictive porcelain composition of the present embodiment, the content of SiO$_2$ in the contained glass component is 8% by mass or less, preferably 6% by mass or less, further preferably 4% by mass or less. When the content of SiO$_2$ in the glass component is set to a predetermined range, further dense piezoelectric/electrostrictive ceramic or portion can be formed. It is to be noted that a lower limit value of the SiO$_2$ content of the glass component is not especially limited, and may be substantially 0.5% by mass or more.

In the piezoelectric/electrostrictive porcelain composition of the present embodiment, 0.05 to 2.0% by mass in total of one or more oxides of metal elements selected from the group consisting of Ni, Ce, Pr, Nd, Sm, Eu, Gd, Tb, Dy, Ho, Er, Tm, Yb is added to the Pb(Mg$_{1/3}$Nb$_{2/3}$)O$_3$—PbTiO$_3$—PbZrO$_3$ ternary system solid solution composition or the Pb(Mg, Ni)$_{1/3}$Nb$_{2/3}$O$_3$—PbTiO$_3$—PbZrO$_3$ ternary system solid solution composition. This is preferable because the obtained piezoelectric/electrostrictive ceramic or portion can be further densified, 0.08 to 1.5% by mass is further preferably added, and 0.1 to 1.0% by mass is especially preferably added.

Moreover, in the piezoelectric/electrostrictive porcelain composition of the present embodiment, at least a part of the surface of the contained piezoelectric/electrostrictive component comprises particles coated with the glass component. That is, the piezoelectric/electrostrictive porcelain composition in a state in which the surfaces of the piezoelectric/electrostrictive component particles are coated with the glass components is a particulate (or powdered) composition. Therefore, by the use of this piezoelectric/electrostrictive porcelain composition, during the firing, the glass components can be more uniformly present among piezoelectric/electrostrictive crystal particles. Therefore, since the glass component can exist mostly among the crystal particles of the piezoelectric/electrostrictive components, more glass components do not have to be contained, and the content of the glass component of the formed piezoelectric/electrostrictive ceramic or portion can be adjusted into a further optimum amount.

On the other hand, in the piezoelectric/electrostrictive porcelain composition of the present embodiment, both the piezoelectric/electrostrictive component and the glass component comprise particles, and an average particle diameter of the particles constituted of the glass component is smaller than that of the particles constituted of the piezoelectric/electrostrictive component. This is preferable because the glass component can be more uniformly present among the piezoelectric/electrostrictive crystal particles during the firing. A ratio (Dg/Df) of an average particle diameter (Df) of the particles constituted of the piezoelectric/electrostrictive component to an average particle diameter (Dg) of the particles constituted of the glass component is preferably 0.7 or less, further preferably 0.5 or less.

Next, an embodiment of a piezoelectric/electrostrictive ceramic of the present invention will be described. The piezoelectric/electrostrictive ceramic of the present embodiment is a piezoelectric/electrostrictive ceramic comprising crystal grains constituted of any piezoelectric/electrostrictive porcelain composition according to the above-described embodiment of the present invention. That is, the piezoelectric/electrostrictive ceramic of the present embodiment comprises: crystal grains constituted of the piezoelectric/electrostrictive porcelain composition including the piezoelectric/electrostrictive component containing lead titanate zirconate, and 0.5 to 5% by mass of glass component containing 8% by mass or less of $SiO_2$.

As described above, the piezoelectric/electrostrictive porcelain composition according to the embodiment of the present invention contains the predetermined amount of the specific glass component in which the content of $SiO_2$ is controlled in the predetermined range. Therefore, the piezoelectric/electrostrictive ceramic of the present embodiment formed by the crystal grains obtained by firing the porcelain composition is denser and superior in crystallinity, and has superior piezoelectric/electrostrictive characteristic and durability even under high temperature with high humidity conditions. Furthermore, since the specific glass component is contained, the sintered body is obtained at a comparatively low firing temperature. Therefore, since the Ag—Pd electrode having a lower melting point as compared with the Pt electrode can be positively used, the energy costs can be reduced, and the versatility is superior.

Moreover, the average grain diameter of crystal grains constituting the piezoelectric/electrostrictive ceramic of the present embodiment is preferably 0.3 to 5 μm, further preferably 1 to 4 μm, and especially preferably 1.3 to 3.7 μm. When the average grain diameter is less than 0.3 μm, a domain in the piezoelectric/electrostrictive ceramic does not sufficiently develop in some cases. Therefore, the piezoelectric/electrostrictive characteristics sometimes deteriorate. On the other hand, when the average grain diameter exceeds 5 μm, the domain in the piezoelectric/electrostrictive ceramic sufficiently develops. However, the domain does not easily move, and the piezoelectric/electrostrictive characteristics are reduced in some cases. It is to be noted that the whole shape of the piezoelectric/electrostrictive ceramic of the present embodiment can be formed into various shapes. Concretely, preferable examples include a block shape (so-called bulk ceramic), a sheet shape and the like.

Next, the embodiment of a piezoelectric/electrostrictive film type device of the present invention will be concretely described with reference to the drawings. As shown in FIG. 1, a piezoelectric/electrostrictive film type device 51 of the present embodiment comprises a substrate 1 constituted of a ceramic, a film-like piezoelectric/electrostrictive portion 2, and film-like electrodes 4, 5 electrically connected to the piezoelectric/electrostrictive portion 2, and the piezoelectric/electrostrictive portion 2 is solidly bonded onto the substrate 1 via the electrode 4. It is to be noted that the piezoelectric/electrostrictive portion may be solidly bonded onto the substrate directly, not via the electrode. It is to be noted that "solidly bonded" in the present specification means a state in which a first piezoelectric portion 2 is closely/integrally fastened to the substrate 1 by a solid-phase reaction with the substrate 1 or the electrode 4 without using any organic or inorganic adhesive.

The piezoelectric/electrostrictive portion 2 of the piezoelectric/electrostrictive film type device 51 of the present embodiment comprises crystal grains constituted of any piezoelectric/electrostrictive porcelain composition according to the above-described embodiment of the present invention. That is, the piezoelectric/electrostrictive portion 2 of the piezoelectric/electrostrictive film type device 51 of the present embodiment comprises crystal grains constituted of the piezoelectric/electrostrictive porcelain composition including a piezoelectric/electrostrictive component containing lead titanate zirconate and 0.5 to 5% by mass of glass component whose $SiO_2$ content is 8% by mass or less.

As described above, the piezoelectric/electrostrictive porcelain composition according to the embodiment of the present invention contains a predetermined amount of a specific glass component whose $SiO_2$ content has been controlled into the predetermined range. Therefore, the piezoelectric/electrostrictive portion 2 formed using the composition is denser, and a glass layer exists in a grain boundary. Therefore, the portion has superior piezoelectric/electrostrictive characteristic and durability even under high temperature with high humidity conditions. Furthermore, since the portion contains the specific glass component, the portion is obtained at a comparatively low firing temperature. Therefore, since an Ag electrode or an Ag—Pd electrode having a lower melting point as compared with a Pt electrode can be positively used, the energy costs can be reduced, and the versatility is superior.

Moreover, an average particle diameter of the crystal particles constituting the piezoelectric/electrostrictive portion 2 of the piezoelectric/electrostrictive film type device 51 of the present embodiment is preferably 0.3 to 5 μm, further preferably 1 to 4 μm, especially preferably 1.3 to 3.7 μm. When the average particle diameter is less than 0.3 μm, the domain in the piezoelectric/electrostrictive portion 2 does not sufficiently develop in some case, flexural displacement deteriorates, and linearity of the flexural displacement with respect to an electric field in a high electric field region deteriorates in some case. On the other hand, when the average particle diameter exceeds 5 μm, the domain in the piezoelectric/electrostrictive portion 2 sufficiently develops. On the other hand, the domain does not easily move, and the flexural displacement is reduced in some case.

Figure 3:
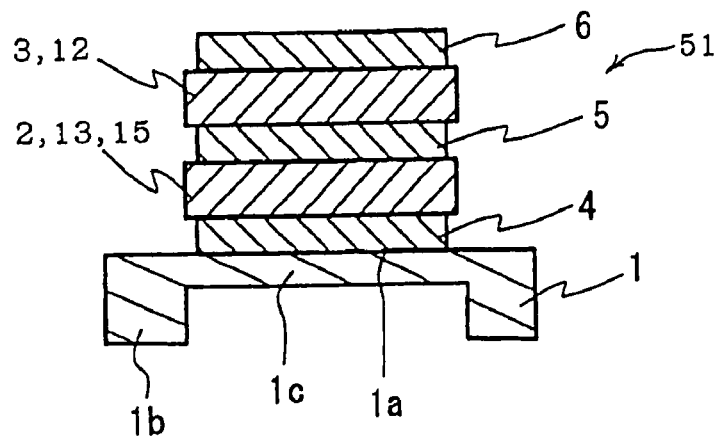
FIG. 3 is a sectional view schematically showing still another embodiment of the piezoelectric/electrostrictive device made of the piezoelectric/electrostrictive film according to the present invention.

Moreover, as shown in FIG. 3, the piezoelectric/electrostrictive film type device 51 of the present embodiment comprises a plurality of piezoelectric/electrostrictive portions 2, 3, and a plurality of electrodes 4, 5, 6, and the plurality of piezoelectric/electrostrictive portions 2, 3 are preferably alternately laminated with being sandwiched by the plurality of electrodes 4, 5, 6. This constitution is a so-called multilayered constitution, and a large flexural displacement can be preferably obtained at a low voltage.

In the piezoelectric/electrostrictive film type device 51 (see FIG. 1) of the present embodiment, a thickness of the piezoelectric/electrostrictive portion 2 is preferably 0.5 to 50 μm, further preferably 0.8 to 40 μm, especially preferably 1.0 to 30 μm. When the thickness of the piezoelectric/electrostrictive portion 2 is less than 0.5 μm, even the piezoelectric/electrostrictive portion constituted of the piezoelectric/electrostrictive porcelain composition according to the embodiment of the present invention is sometimes insufficiently densified. On the other hand, when the thickness of the piezoelectric/electrostrictive portion 2 exceeds 50 μm, compression stress of the piezoelectric/electrostrictive porcelain composition at the firing time increases. A thicker substrate 1 is required for preventing the substrate 1 from being broken, and it is sometimes difficult to cope with miniaturization of the device. It is to be noted that the thickness of the piezoelectric/electrostrictive portion 2 or 3 in a case where the piezoelectric/electrostrictive film type device 51 has a so-called multilayered constitution as shown in FIG. 3 refers to the thickness of each of the piezoelectric/electrostrictive portions 2, 3.

The substrate constituting the piezoelectric/electrostrictive film type device according to the embodiment of the present invention is constituted of a ceramic, and a kind of the ceramic is not especially limited. From heat resistance, chemical stability, and insulating property, a ceramic is preferable containing at least one member selected from a group consisting of stabilized zirconium oxide, aluminum oxide, magnesium oxide, mullet, aluminum nitride, silicon nitride, and glass. Above all, stabilized zirconium oxide is further preferable because mechanical strength is large and tenacity is superior. It is to be noted that "stabilized zirconium oxide" in the present invention refers to zirconium oxide in which phase transition of crystal is inhibited by addition of a stabilizer. In addition to stabilized zirconium oxide, partially stabilized zirconium oxide is included.

As stabilized zirconium oxide, zirconium oxide contains 1 to 30 mol % of stabilizer such as calcium oxide, magnesium oxide, yttrium oxide, scandium oxide, ytterbium oxide, cerium oxide, or oxide of a rare earth metal. Above all, yttrium oxide is preferably contained as the stabilizer because the mechanical strength of the vibrating portion is especially high. In this case, yttrium oxide is contained by preferably 1.5 to 6 mol %, further preferably 2 to 4 mol %. Furthermore, 0.1 to 5 mol % of aluminum oxide is preferably contained. A crystal phase of stabilized zirconium oxide may be a mixed phase of cubic system+monoclinic system, a mixed phase of tetragonal system+monoclinic system, a mixed phase of cubic system+tetragonal system+monoclinic system or the like, but a main crystal phase is preferably a tetragonal system, or a mixed phase of tetragonal system+cubic system from viewpoints of strength, tenacity, and durability.

It is to be noted that the thickness of the substrate is preferably 1 μm to 1 mm, further preferably 1.5 to 500 μm, especially preferably 2 to 200 μm. When the thickness of the substrate is less than 1 μm, the mechanical strength of the piezoelectric/electrostrictive film type device sometimes drops. On the other hand, when the thickness exceeds 1 mm, and a voltage is applied to the piezoelectric/electrostrictive portion, rigidity of the substrate with respect to the generated compression stress increases, and the flexural displacement of the piezoelectric/electrostrictive portion sometimes decreases.

Figure 2:
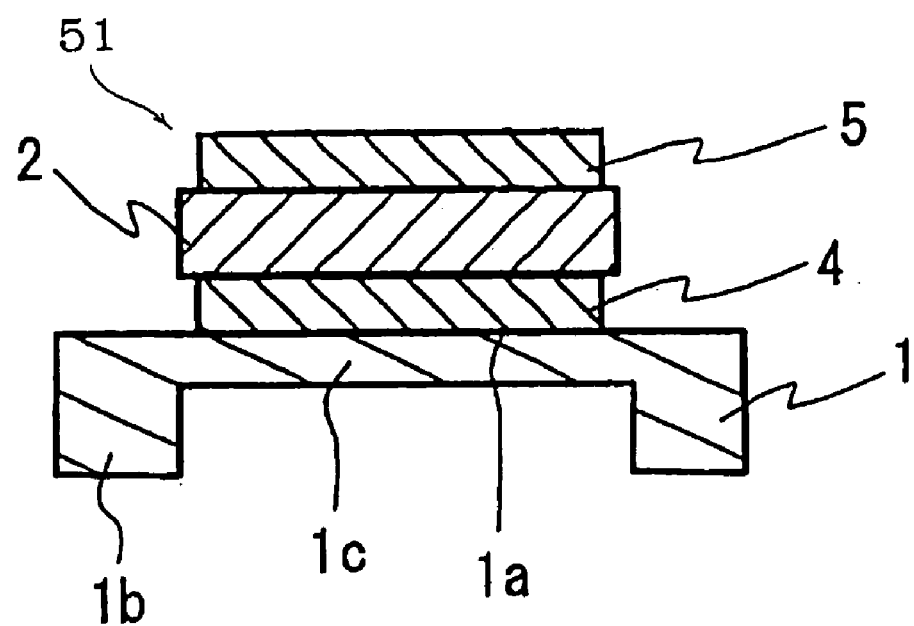
FIG. 2 is a sectional view schematically showing another embodiment of the piezoelectric/electrostrictive device made of the piezoelectric/electrostrictive film according to the present invention.
Figure 4:
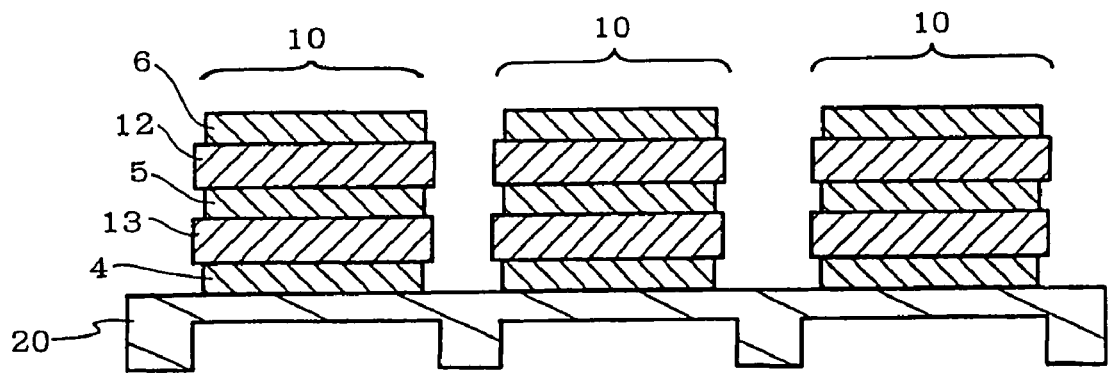
FIG. 4 is a sectional view schematically showing still another embodiment of the piezoelectric/electrostrictive device made of the piezoelectric/electrostrictive film according to the present invention.

Additionally, as shown in FIG. 2, a shape of the substrate 1 may comprise a thin-walled portion 1c having the above-described thickness, on whose surface a solidly bonded surface 1a is formed, and a thick-walled portion 1b which is disposed on a portion other than a portion facing the solidly bonded surface 1a and which is thicker than the thin-walled portion 1c. It is to be noted that the electrode 4 (or the piezoelectric/electrostrictive portion) is disposed on a region substantially facing the solidly bonded surface 1a. When the substrate 1 has this shape, a piezoelectric/electrostrictive film type device having sufficiently large flexural displacement and large mechanical strength can be constituted. A common substrate 20 on which the shape of the substrate 1 shown in FIG. 2 is continuously formed as shown in FIG. 4 is used, and a plurality of piezoelectric/electrostrictive film type device units 10 each including a first piezoelectric/electrostrictive portion 12, a second piezoelectric/electrostrictive portion 13, and electrodes 4, 5, 6 may be disposed on the common substrate 20.

The surface shape (shape of the surface to which the electrode 4 is solidly bonded in FIG. 1) of the substrate in the piezoelectric/electrostrictive film type device according to the embodiment of the present invention is not especially limited, and examples of the shape include a rectangular shape, a square shape, a triangular shape, an elliptic shape, a perfect circle shape, an R-square shape, an R-rectangular shape, a complex shape obtained by combining these shapes and the like. The shape of the whole substrate is not especially limited, and may be a capsule shape having an appropriate internal space.

Figure 7:
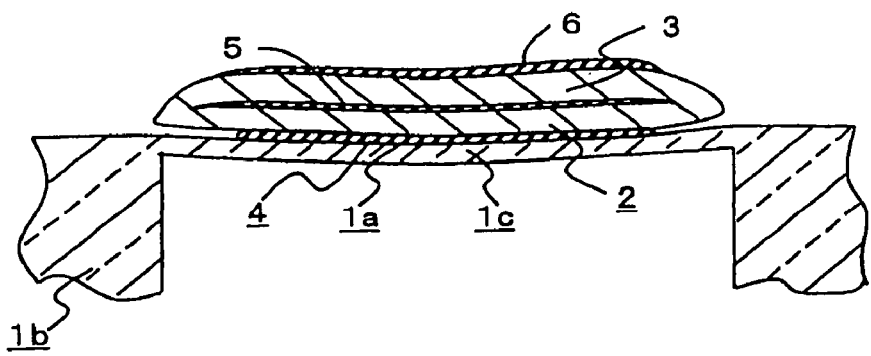
FIG. 7 is a sectional view showing another more concrete example of the embodiment shown in FIG. 3.
Figure 8:
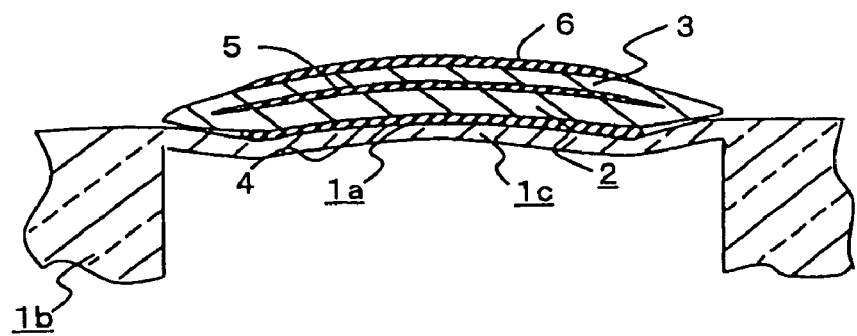
FIG. 8 is a sectional view showing still another more concrete example of the embodiment shown in FIG. 3.

Moreover, as the shape of the thin-walled portion of the substrate, a shape whose middle portion is bent on a side opposite to the surface on which the piezoelectric/electrostrictive portions 2, 3 are disposed as shown in FIG. 7, or a W sectional shape in a thickness direction, having three inflection points as shown in FIG. 8 is preferable in that linearity of flexural displacement with respect to an electric field is high. It is to be noted that the bent shape shown in FIG. 8 can be formed utilizing contraction in a step of firing the respective piezoelectric/electrostrictive portions 2, 3, and the W shape shown in FIG. 7 can be formed by adjustment of a firing contraction start timing or a firing contraction amount of the piezoelectric/electrostrictive portions 2 and 3, and further the shape of the thin-walled portion 1c.

In the piezoelectric/electrostrictive film type device of the present embodiment, the electrode is electrically connected to the piezoelectric/electrostrictive portion, and is disposed between the piezoelectric/electrostrictive portions. The electrode is preferably disposed including a region of the piezoelectric/electrostrictive portion substantially contributing to the flexural displacement or the like. For example, on the surfaces on which the first and second piezoelectric/electrostrictive portions 12 and 13 are formed, each of the electrodes 4, 5, 6 is preferably disposed in 80% by area or more of region including a middle portion of each of the surfaces.

Figure 5A:
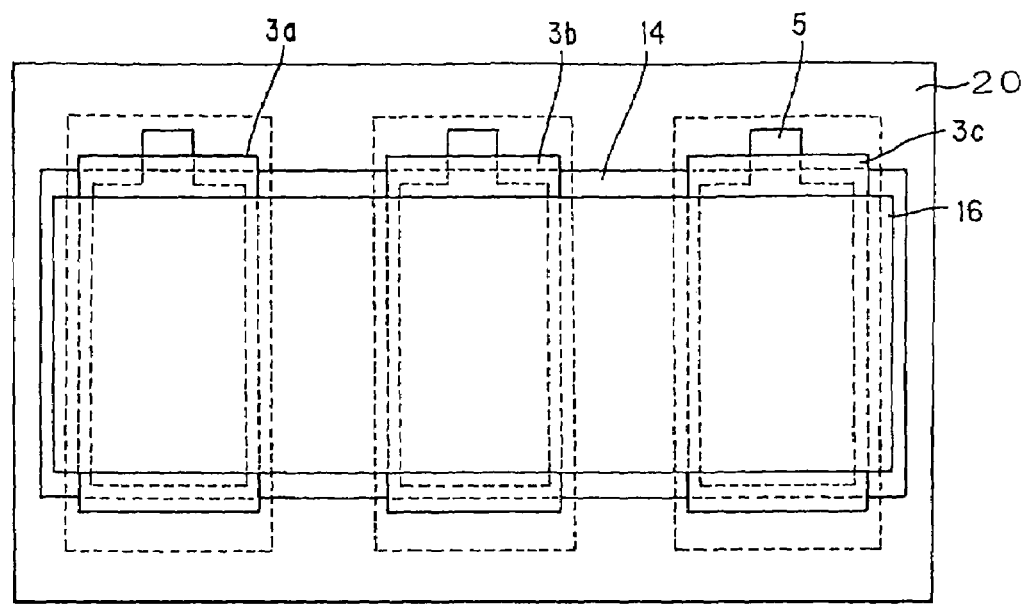
FIG. 5(*a*) is a top plan view schematically showing still another embodiment of the piezoelectric/electrostrictive device made of the piezoelectric/electrostrictive film according to the present invention.
Figure 5B:
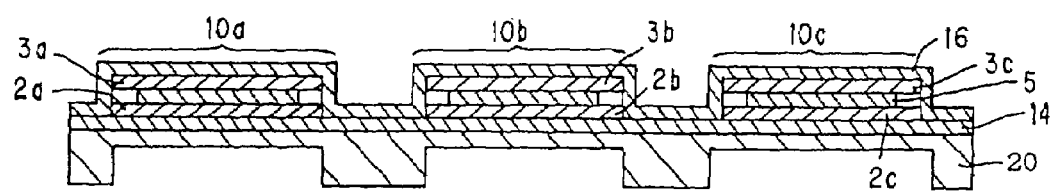

Moreover, as shown in FIGS. 5(a), 5(b), in a case where a plurality of piezoelectric/electrostrictive film type device units 10a to 10c share the common substrate 20, an electrode 14 of a lowermost layer and an electrode 16 of an uppermost layer in the respective piezoelectric/electrostrictive film type device units 10a to 10c are shared among the respective piezoelectric/electrostrictive film type device units 10a to 10c, and the electrode 14 may be an integral electrode disposed on a region facing piezoelectric/electrostrictive portions 2a to 2c, 3a to 3c. The integral electrode 14 does not have to be formed into a shape in accordance with the individual piezoelectric/electrostrictive portions 2a to 2c, 3a to 3c, and positioning is facilitated during the forming of the electrode.

Figure 6:
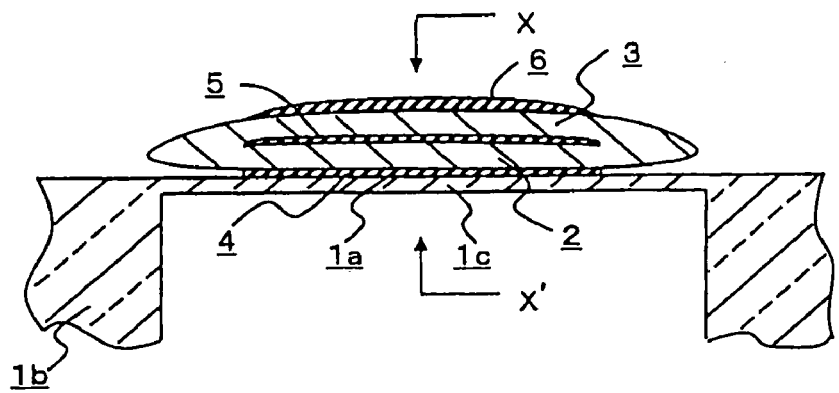
FIG. 6 is a sectional view showing a more concrete example of the embodiment shown in FIG. 3.
Figure 9:
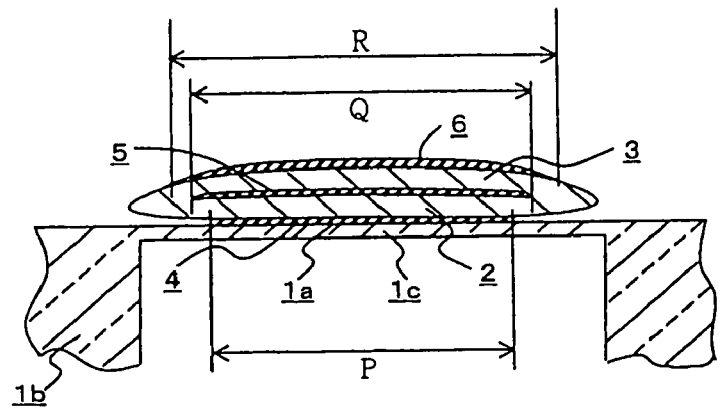
FIG. 9 is a sectional view showing still another more concrete example of the embodiment shown in FIG. 3.
Figure 12A:
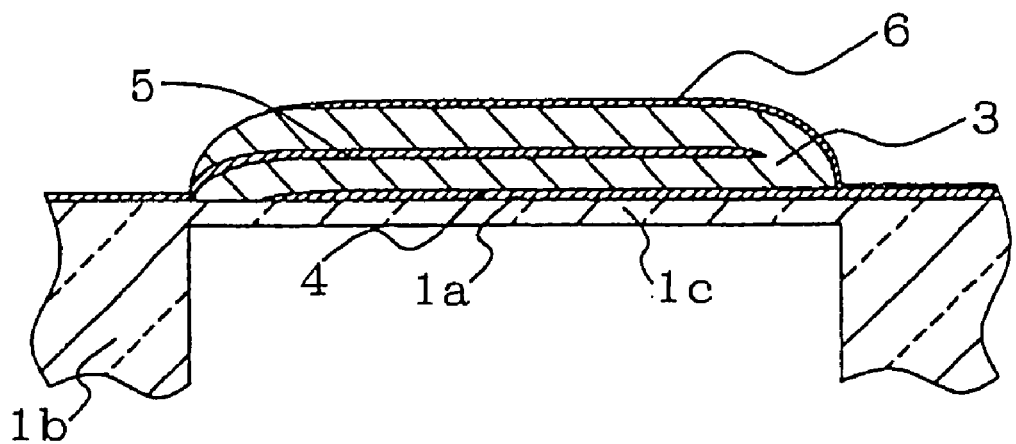
FIG. 12(*a*) is an X-X' sectional view of the embodiment shown in FIG. 6.
Figure 12B:
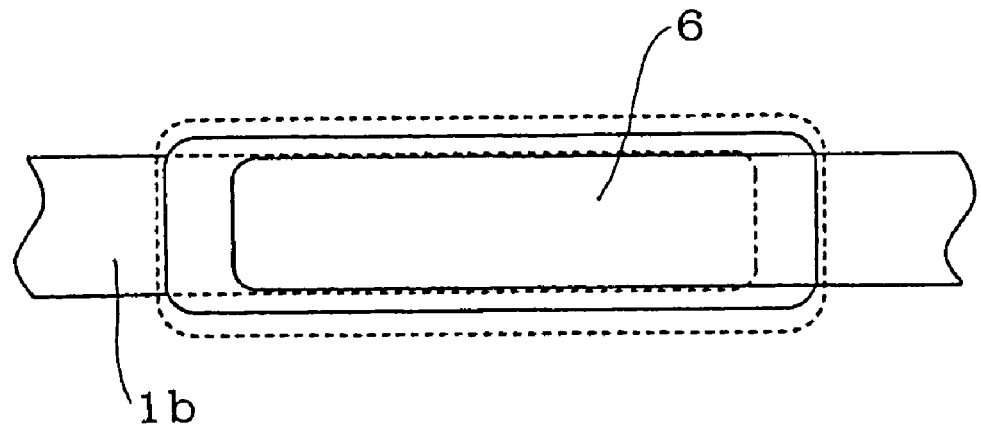

In the piezoelectric/electrostrictive film type device of the present embodiment, examples of a material of the electrode include at least one metal selected from a group consisting of Pt, Pd, Rh, Au, Ag, and an alloy of them. Above all, platinum, or an alloy mainly composed of platinum is preferable as far as heat resistance is concerned; this is because Pt or its alloy is high in heat resistance during the firing of the piezoelectric/electrostrictive portion. Considering that the piezoelectric/electrostrictive portion can be formed at a lower firing temperature, an alloy such as Ag—Pd is preferably usable. A dimension of the electrode is not especially limited, but, for example, as shown in FIGS. 6, 12(a), 12(b), the respective electrodes 4, 5, 6 are set to an equal dimension, and may be disposed in positions facing one another in the same range in a thickness direction. As shown in FIG. 9, the respective electrodes 4, 5, 6 may be preferably disposed in a broader range including a range corresponding to the electrode positioned below in order from the electrode 4 positioned in the lowermost layer. In this constitution, since the piezoelectric/electrostrictive portion positioned in the upper layer can be distorted more largely than the piezoelectric/electrostrictive portion positioned in the lower layer, bending efficiency can be raised, and the flexural displacement can be more effectively developed.

Figure 10:
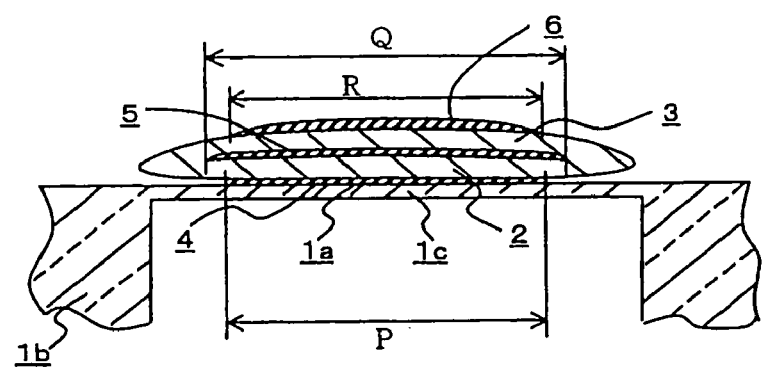
FIG. 10 is a sectional view showing still another more concrete example of the embodiment shown in FIG. 3.
Figure 11:
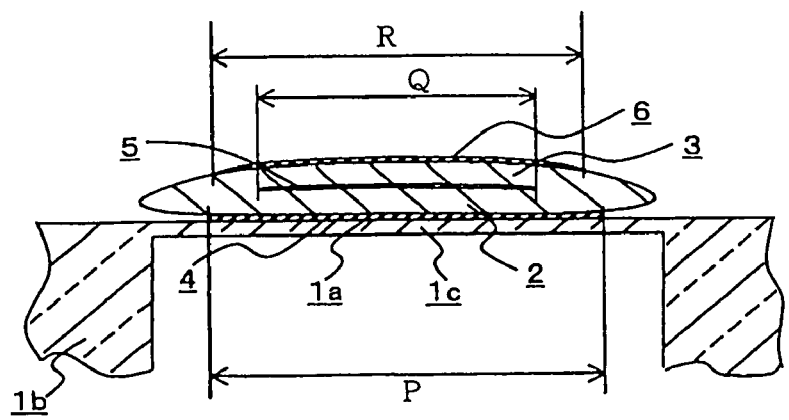
FIG. 11 is a sectional view showing still another more concrete example of the embodiment shown in FIG. 3.

Additionally, when a driving voltage of the piezoelectric/electrostrictive film type device is raised to thereby obtain large flexural displacement, the electrode 5 positioned in the middle is preferably disposed in a range broader than that of each of the electrodes 4, 6 positioned in the lower and upper layers, respectively, as shown in FIG. 10, or the electrode 5 positioned in the middle is preferably disposed in a range narrower than that of each of the electrodes 4, 6 as shown in FIG. 11. By this constitution, an electric field is hardly applied in the vicinity of a (short-side direction) end portion in which the thickness of the piezoelectric/electrostrictive portion 2 or 3 is easily reduced, and dielectric breakdown of the piezoelectric/electrostrictive portion 2, 3 can be avoided. A width difference in a case where the width difference is disposed in a range in which the electrode is disposed is preferably optimized in consideration of an electric field distribution. For example, between the adjacent electrodes 4, 5 (or 5, 6) via the piezoelectric/electrostrictive portion 2 (or 3), a value of a ratio of an area (area of the formed surface) in which the electrode is disposed is preferably 0.5 to 2, further preferably 0.67 to 1.5, especially preferably 0.83 to 1.2. It is to be noted that in FIGS. 9 to 11, symbol P denotes a width of a lower electrode, Q denotes a width of an intermediate electrode, and R denotes a width of an upper electrode, respectively.

In the piezoelectric/electrostrictive film type device of the present embodiment, the thickness of the electrode is preferably 15 μm or less, further preferably 5 μm or less. When the thickness exceeds 15 μm, the electrode functions as a relaxing layer, and the flexural displacement is sometimes reduced. It is to be noted that the thickness of the electrode may be 0.05 μm or more from a viewpoint that a substantial function of the electrode be exerted.

Next, a method for preparing a piezoelectric/electrostrictive porcelain composition according to the embodiment of the present invention will be described. The piezoelectric/electrostrictive porcelain composition of the present embodiment can be prepared by mixing a vitreous component with a calcined to crush mixed material obtained by mixing various raw materials in accordance with the composition of a piezoelectric/electrostrictive component. Alternatively, the piezoelectric/electrostrictive porcelain composition constituted of the piezoelectric/electrostrictive component only is mixed with the vitreous component, calcined, and thereafter crushed. As a representative example, a method for preparing a piezoelectric/electrostrictive porcelain composition containing a piezoelectric/electrostrictive component mainly composed of a $Pb(Mg_{1/3}Nb_{2/3})O_3$—$PbTiO_3$—$PbZrO_3$ ternary system solid solution composition, and a vitreous component mainly composed of a $ZnO$—$PbO$—$B_2O_3$-based glass will be concretely described.

First, elements such as Pb, Mg, Nb, Zr, Ti, oxides of these elements ($PbO$, $Pb_3O_4$, $MgO$, $Nb_2O_5$, $TiO_2$, $ZrO_2$, etc.), carbonate ($MgCO_3$, etc.), compounds containing a plurality of elements ($MgNb_2O_6$, etc.) and the like are mixed in such a manner that a content of each element is a desired composition ratio of ternary system solid solution composition. As a mixing method, a general method may be used, and examples include ball mill. Concretely, predetermined amounts of various raw materials, balls, and water are charged into a ball mill device, and the device is rotated for a predetermined time only to thereby prepare a mixed slurry. Thereafter, a water content contained in the obtained mixed slurry is evaporated and dried, filtered, or removed otherwise so that the mixed raw material can be obtained.

After calcining the obtained mixed raw material at 750 to 1300° C., a predetermined amount of a glass component mainly composed of $ZnO$—$PbO$—$B_2O_3$-based glass is added, mixed again, and calcined at 750 to 1300° C. Accordingly, a piezoelectric/electrostrictive porcelain composition can be obtained. It is to be noted that after calcining the mixed raw material, the obtained calcined matter only may be crushed, and the glass component may be added. The added mixed glass component may be formed into the piezoelectric/electrostrictive porcelain composition without being calcined. As a diffraction strength by an X-ray diffraction device of the obtained piezoelectric/electrostrictive porcelain composition, a ratio of a strength of a strongest diffraction line of a pyrochlore phase to that of the strongest diffraction line of a perovskite phase is preferably 5% or less, further preferably 2% or less.

When the obtained piezoelectric/electrostrictive porcelain composition is crushed using a general crushing device such as a ball mill, attritor, or bead mill, the piezoelectric/electrostrictive porcelain composition can be formed into a state in which the surface of a particulate (or powdered) piezoelectric/electrostrictive component is coated with the glass component. An average particle diameter of the particulate piezoelectric/electrostrictive porcelain composition is preferably 0.1 to 1.0 μm, further preferably 0.2 to 0.7 μm. It is to be noted that a particle diameter may be adjusted by a heat treatment of powder of the crushed piezoelectric/electrostrictive porcelain composition at 400 to 750° C. In this case, smaller particles are integrated with other particles to form the powder having a uniform particle diameter, and a piezoelectric/electrostrictive portion having a uniform grain diameter can be preferably obtained. The piezoelectric/electrostrictive porcelain composition may be prepared, for example, by alkoxide process, coprecipitation process or the like.

Next, a method of manufacturing a piezoelectric/electrostrictive ceramic according to the embodiment of the present invention will be described. First, the powdered piezoelectric/electrostrictive porcelain composition obtained by the above-described method is compacted to form it into a desired size with an appropriate pressure. An obtained green compact is fired at 800 to 1300° C. for one minute to ten hours, and accordingly a sintered body having a predetermined shape can be obtained. Subsequently, after the sintered body is cut into appropriate sizes, the electrodes are formed, and poling is performed so that a piezoelectric/electrostrictive ceramic (bulk ceramic) can be obtained.

Moreover, to form the whole shape of the piezoelectric/electrostrictive ceramic into a sheet shape, a plasticizer, dispersant, solvent or the like is added to the piezoelectric/ electrostrictive porcelain composition, the composition is slurried using a general mixing device such as a ball mill, and thereafter the composition is formed into a sheet shape by a general sheet forming machine such as a doctor blade.

Next, a method of manufacturing a piezoelectric/electrostrictive film type device according to the embodiment of the present invention will be described. First, a layer constituted of a piezoelectric/electrostrictive porcelain composition is formed on a substrate constituted of a ceramic or an electrode formed on the substrate surface. Examples of the method for forming the electrode include an ion beam method, sputtering, vacuum evaporation, PVD, ion plating, CVD, plating, aerosol deposition, screen printing, spraying, dipping and the like. Above all, the sputtering method or the screen printing method is preferable in a bonding property with respect to the substrate and the piezoelectric/electrostrictive portion. An appropriate temperature is selected in accordance with the material of the formed electrode, but the electrode can be integrated with the substrate and/or the piezoelectric/electrostrictive portion by a heat treatment at about 800 to 1400° C. This heat treatment may be performed every time the electrode is formed, but, may be performed together with firing with respect to the layer constituted of the piezoelectric/electrostrictive porcelain composition. Additionally, after the layer constituted of the piezoelectric/electrostrictive porcelain composition is formed, a heat treatment at a temperature exceeding the firing temperature of the piezoelectric/electrostrictive porcelain composition layer is not performed.

Examples of a method for forming the layer constituted of the piezoelectric/electrostrictive porcelain composition on the substrate include an ion beam method, sputtering, vacuum evaporation, PVD, ion plating, CVD, plating, sol-gel, aerosol deposition, screen printing, spraying, dipping and the like. Above all, the screen printing method is preferable because the layer can be easily continuously formed into high-precision shape and thickness. It is to be noted that to prepare a piezoelectric/electrostrictive film type device comprising a plurality of piezoelectric/electrostrictive portions and electrodes which are alternately laminated by sandwiching each other, the electrodes are formed on the layer constituted of the piezoelectric/electrostrictive porcelain composition formed on the substrate by the same method as the above-described method. It is to be noted that the layer constituted of the piezoelectric/electrostrictive porcelain composition, and the electrode are repeatedly alternately formed on the electrode in such a manner as to obtain desired multiple layers.

Thereafter, a laminate obtained by alternately laminating the layers constituted of the piezoelectric/electrostrictive porcelain compositions, and the electrodes on the substrate is integrally fired. By this firing, the piezoelectric/electrostrictive portion comprising crystal grains constituted of the piezoelectric/electrostrictive porcelain compositions can be solidly bonded to the substrate directly or via the electrode. It is to be noted that this firing does not have to be necessarily integrally performed, and may be successively performed every time one layer constituted of the piezoelectric/electrostrictive porcelain composition is formed. From a viewpoint of production efficiency, the laminate is preferably integrally fired including the electrodes.

The firing temperature is preferably 800 to 1350° C., further preferably 900 to 1300° C. When the temperature is less than 800° C., the substrate or the electrode is solidly bonded to the piezoelectric/electrostrictive portion incompletely, or denseness of the piezoelectric/electrostrictive portion is insufficient in some case. When the temperature exceeds 1350° C., the piezoelectric/electrostrictive component in the piezoelectric/electrostrictive porcelain composition reacts with the glass component, and it is sometimes difficult to form the piezoelectric/electrostrictive portion having a desired composition. The highest temperature retaining time is preferably one minute or more and ten hours or less, further preferably five minutes or more and four hours or less. When the highest temperature retaining time is less than one minute, densification of the piezoelectric/electrostrictive portion is easily insufficient, and a desired characteristic cannot be obtained in some case. When the highest temperature retaining time exceeds ten hours, reaction of the piezoelectric/electrostrictive component with the glass component proceeds even at a low temperature. The piezoelectric/electrostrictive characteristic deteriorates, a glass layer of a grain boundary decreases, and durability at high temperature and humidity disadvantageously drops.

Thereafter, poling is performed on appropriate conditions. The poling is preferred to be performed by heating according to a known method. It is to be noted that a heating temperature depends on Curie point of piezoelectric/electrostrictive porcelain, and is preferably set at 40 to 200° C.

EXAMPLES

A particular explanation will be given to the present invention according to the examples as follows, however, the present invention should not be limited to these examples.

Examples 1 to 3, Comparative Examples 1, 2

A piezoelectric/electrostrictive component mainly composed of a $Pb(Mg_{1/3}Nb_{2/3})O_3$—$PbTiO_3$—$PbZrO_3$ ternary system solid solution composition represented by $Pb_{0.944}Sr_{0.050}La_{0.006}(Mg_{1/3}Nb_{2/3})_{0.375}Ti_{0.375}Zr_{0.250}O_3$, and a glass component containing 51.5% by mass of ZnO, 28.2% by mass of PbO, 17.7% by mass of $B_2O_3$, and 2.25% by mass of $SiO_2$ were added and mixed in such a manner that each contained glass component was in a range of 0.3 to 7% by mass, and five types of powders of piezoelectric/electrostrictive porcelain compositions having different contents of glass components were prepared.

A green compact was obtained by forming each prepared powder of the piezoelectric/electrostrictive porcelain composition into a diameter of 20 mm×thickness of 6 mm at a pressure of 0.5 t/cm². The obtained green compact was contained in a magnesia vessel, and fired at 1000° C. for three hours to thereby obtain a sintered body. The obtained sintered body was processed into a size of 12 mm×3 mm×1 mm, silver paste was coated on the opposite surfaces, followed by baking, and this body was immersed in silicon oil at 70° C. A direct-current voltage of 2 kV/mm was applied between the electrodes for 15 minutes to thereby perform poling, and piezoelectric/electrostrictive bodies (Examples 1 to 3, Comparative Examples 1, 2) were obtained.

A piezoelectric/electrostrictive ceramic (Comparative Example 3) was obtained in the same manner as in the above-described "Examples 1 to 3, Comparative Examples 1, 2" except that 47.5% by mass of ZnO, 26.1% by mass of PbO, 16.3% by mass of $B_2O_3$, and 10.0% by mass of $SiO_2$ were added in such a manner that each element contained 3% by mass of glass component. It is to be noted that mass ratios of ZnO, PbO, and $B_2O_3$ of the glass component used here are equal to those of ZnO, PbO, and $B_2O_3$ of the glass component used in Examples 1 to 3 and Comparative Examples 1, 2, and a content ratio of $SiO_2$ only differs.

Measurement of Various Physical Property Values

With respect to the respective obtained piezoelectric/electrostrictive ceramics of Examples 1 to 3 and Comparative Examples 1 to 3, bulk densities, $d_{31}$ constants, specific inductive capacities, and electric field induced strains were measured. Measurement results are shown in Table 1.

The bulk density was measured with respect to each fired body by Archimedes process.

The $d_{31}$ Constant and, Specific Inductive Capacity were measured in accordance with Standard of Electronic Materials Manufacturers Association of Japan "Piezoelectric Ceramic Vibrator Electric Test Method EMAS-6100."

To measure the Electric Field Induced Strain, a strain gauge was attached to the electrode, and a strain in a direction vertical to an electric field where a voltage of 3 kV/mm was applied was measured as the electric field induced strain. It is to be noted that as a comparative object, assuming that the electric field induced strain of a $Pb(Mg_{1/3}Nb_{2/3})O_3$—$PbTiO_3$—$PbZrO_3$ ternary system solid solution composition to which any glass component was not added and which was fired at 1250° C. was 100%, a ratio to this strain was evaluated.

Driving Experiment at High Temperature and Humidity

One hundred samples were prepared with respect to each of the examples and comparative examples, driving was performed at an applied voltage of 0 to 2 kV and with a frequency of 100 Hz on conditions at a temperature of 40° C. and humidity of 95% RH, and electric field induced strains were measured with respect to the respective samples in an initial stage (0 cycle) and after $10^8$, $10^9$ cycle driving. The numbers of the samples were counted, the numbers were the sums of electric field induced strains after the $10^8$, $10^9$ cycle driving were 90% or less of the values of the initial electric field induced strains. Measurement results are shown in Table 1.

electrostrictive characteristics and durability, although the glass components were contained to densify the body.

INDUSTRIAL APPLICABILITY

The piezoelectric/electrostrictive ceramic, and the piezoelectric/electrostrictive film type device of the present invention have superior piezoelectric/electrostrictive characteristics, and durability, and are suitable for actuators, sensors and the like. In particular, the superior durability is exhibited even in a case where the ceramic and the device are used under high temperature and high humidity conditions after installation.

What is claimed is:

1. A piezoelectric/electrostrictive porcelain composition comprising:
   a piezoelectric/electrostrictive component containing mainly a $Pb(Mg_{1/3}Nb_{2/3})O_3$—$PbTiO_3$—$PbZrO_3$ ternary system solid solution; and
   0.5 to 5% by mass of a glass component mainly composed of a ZnO—PbO—$B_2O_3$-based glass that contains $SiO_2$ in a range of 0.5% by mass to 8% by mass;
   wherein the $Pb(Mg_{1/3}Nb_{2/3})O_3$—$PbTiO_3$—$PbZrO_3$ ternary system solid solution composition is represented by the following composition formula (1):

$$Pb_x(Mg_{1/3}Nb_{2/3})_aTi_bZr_cO_3 \qquad (1),$$

wherein $0.90 \leq x \leq 1.10$, and a, b, c denote decimals in a range surrounded with (a, b, c)=(0.550, 0.425, 0.025), (0.550, 0.325, 0.125), (0.375, 0.325, 0.300), (0.100, 0.425, 0.475), (0.100, 0.475, 0.425), (0.375, 0.425, 0.200) in a coordinate including the above a, b, c as coordinates axes (additionally, a+b+c=1.000).

2. The piezoelectric/electrostrictive porcelain composition according to claim 1, wherein a range of x in the composition formula (1) is $0.95 \leq x \leq 1.05$.

3. The piezoelectric/electrostrictive porcelain composition according to claim 1, wherein a part of Pb of the

TABLE 1

| | Glass component content (mass %) | Bulk density (g/cm³) | $d_{31}$ constant (×10⁻¹² m/V) | Specific inductive capacity | Electric field induced strain (%) | Driving experiment at high temperature and humidity | |
|---|---|---|---|---|---|---|---|
| | | | | | | $10^8$ cycle | $10^9$ cycle |
| Comparative Example 1 | 0.3 | 6.3 | −80 | 2100 | 35 | 3 | 5 |
| Example 1 | 1 | 7.2 | −110 | 2730 | 70 | 0 | 0 |
| Example 2 | 3 | 7.6 | −118 | 3080 | 70 | 0 | 0 |
| Example 3 | 5 | 7.5 | −109 | 2250 | 52 | 0 | 0 |
| Comparative Example 2 | 7 | 7.5 | −97 | 2180 | 38 | 0 | 0 |
| Comparative Example 3 | 3 | 7.6 | −84 | 1200 | 34 | 0 | 2 |

As shown in Table 1, the piezoelectric/electrostrictive ceramics of Examples 1 to 3 were obtained by the firing at a comparatively low temperature of 1000° C., but had high bulk densities as compared with the piezoelectric/electrostrictive ceramic of Comparative Example 1, and it was obvious that the ceramics were dense. As apparent from values of the $d_{31}$ constants, specific inductive capacities, electric field induced strains, and driving experiment at high temperature and humidity, the piezoelectric/electrostrictive ceramics of Examples 1 to 3 exhibited high piezoelectric/

$Pb(Mg_{1/3}Nb_{2/3})O_3$—$PbTiO_3$—$PbZrO_3$ ternary system solid solution composition is substituted with Sr and/or La.

4. The piezoelectric/electrostrictive porcelain composition according to claim 3, wherein 3.0 to 10.0 mol % of Pb of the $Pb(Mg_{1/3}Nb_{2/3})O_3$—$PbTiO_3$—$PbZrO_3$ ternary system solid solution composition is substituted with Sr.

5. The piezoelectric/electrostrictive porcelain composition according to claim 4, wherein 0.3 to 5.0 mol % of Pb of the $Pb(Mg_{1/3}Nb_{2/3})O_3$—$PbTiO_3$—$PbZrO_3$ ternary system solid solution composition is substituted with La.

6. The piezoelectric/electrostrictive porcelain composition according to claim 1, wherein 0.05 to 2.0% by mass in total of an oxide of at least one metal element selected from the group consisting of Ni, Ce, Pr, Nd, Sm, Eu, Gd, Tb, Dy, Ho, Er, Tm, and Yb is added to the Pb(Mg$_{1/3}$Nb$_{2/3}$)O$_3$—PbTiO$_3$—PbZrO$_3$ ternary system solid solution composition.

7. The piezoelectric/electrostrictive porcelain composition according to claim 1, wherein a composition of the ZnO—PbO—B$_2$O$_3$-based glass is represented by the following composition formula (2):

$$d \text{ mass \% ZnO-}e \text{ mass \% PbO-}f \text{ mass \% B}_2\text{O}_3 \quad (2),$$

wherein $30 \leq d \leq 70$, $15 \leq e \leq 45$, $10 \leq f \leq 30$.

8. The piezoelectric/electrostrictive porcelain composition according to claim 1, wherein a raw material of the piezoelectric/electrostrictive component comprises particles, and wherein at least a part of surfaces of the particles are coated with the glass component.

9. The piezoelectric/electrostrictive porcelain composition according to claim 1, wherein raw materials for both the piezoelectric/electrostrictive component and the glass component comprise particles, and an average particle diameter of the glass component is smaller than that of an average particle diameter of the piezoelectric/electrostrictive component.

10. A piezoelectric/electrostrictive ceramic comprising:
crystal grains comprising the piezoelectric/electrostrictive porcelain composition according to claim 1.

11. The piezoelectric/electrostrictive ceramic according to claim 10, wherein an average diameter of the crystal grains is in a range of 0.3 to 5 μm.

12. The piezoelectric/electrostrictive ceramic according to claim 10, wherein an entire shape of the piezoelectric/electrostrictive ceramic is a sheet shape.

13. A piezoelectric/electrostrictive film type device comprising:
a ceramic substrate;
a film-like piezoelectric/electrostrictive portion; and
a film-like electrode electrically connected to the piezoelectric/electrostrictive portion;
wherein the piezoelectric/electrostrictive portion is a piezoelectric/electrostrictive film-type device bonded onto the substrate in one of a direct manner and an indirect manner via the electrode; and
wherein the piezoelectric/electrostrictive portion comprising the piezoelectric/electrostrictive porcelain composition recited in claim 1.

14. The piezoelectric/electrostrictive film type device according to claim 13, wherein an average diameter of crystal grains of the piezoelectric/electrostrictive composition is in a range of 0.3 to 5 μm.

15. The piezoelectric/electrostrictive film type device according to claim 13, comprising a plurality of piezoelectric/electrostrictive portions and a plurality of electrodes, wherein the plurality of piezoelectric/electrostrictive portions are alternately laminated to be sandwiched by the plurality of electrodes.

16. The piezoelectric/electrostrictive film type device according to claim 13, wherein a thickness of the piezoelectric/electrostrictive portion is in a range of 0.5 to 50 μm.

17. A piezoelectric/electrostrictive porcelain composition comprising:
a piezoelectric/electrostrictive component mainly composed of a Pb(Mg, Ni)$_{1/3}$Nb$_{2/3}$O$_3$—PbTiO$_3$—PbZrO$_3$ ternary system solid solution composition; and
0.5 to 5% by mass of a glass component mainly composed of ZnO—PbO—B$_2$O$_3$-based glass that contains SiO$_2$ in a range of 0.5% by mass to 8% by mass;
wherein the Pb(Mg, Ni)$_{1/3}$Nb$_{2/3}$O$_3$—PbTiO$_3$—PbZrO$_3$ ternary system solid solution composition is represented by the following composition formula (3);

$$Pb_x\{(Mg_{1-y}Ni_y)_{(1/3)}x_aNb_{2/3}\}_bTi_cZr_dO_3 \quad (3),$$

wherein $0.90 \leq x \leq 1.10$, $0.05 \leq y \leq 0.20$, $0.90 \leq a \leq 1.10$, and b, c, d denote decimals in a range surrounded with (b, c, d)=(0.550, 0.425, 0.250), (0.550, 0.325, 0.125), (0.375, 0.325, 0.300), (0.100, 0.425, 0.475), (0.100, 0.475, 0.425), (0.375, 0.425, 0.200) in a coordinate including the above b, c, d as coordinates axes (additionally, (b+c+d)=1,000).

18. The piezoelectric/electrostrictive porcelain composition according to claim 17, wherein a range of x in the composition formula (3) is $0.95 \leq x \leq 1.05$.

19. The piezoelectric/electrostrictive porcelain composition according to claim 17, wherein a part of Pb of the Pb(Mg, Ni)$_{1/3}$Nb$_{2/3}$O$_3$—PbTiO$_3$—PbZrO$_3$ ternary system solid solution composition is substituted with Sr and/or La.

20. The piezoelectric/electrostrictive porcelain composition according to claim 19, wherein 3.0 to 10.0 mol % of Pb of the Pb(Mg, Ni)$_{1/3}$Nb$_{2/3}$O$_3$—PbTiO$_3$—PbZrO$_3$ ternary system solid solution composition is substituted with Sr.

21. The piezoelectric/electrostrictive porcelain composition according to claim 20, wherein 0.3 to 5.0 mol % of Pb of the Pb(Mg, Ni)$_{1/3}$Nb$_{2/3}$O$_3$—PbTiO$_3$—PbZrO$_3$ ternary system solid solution composition is substituted with La.

22. The piezoelectric/electrostrictive porcelain composition according to claim 17, wherein 0.05 to 2.0% by mass in total of oxide of at least one metal element selected from the group consisting of Ce, Pr, Nd, Sm, Eu, Gd, Tb, Dy, Ho, Er, Tm, and Yb is added to the Pb(Mg, Ni)$_{1/3}$Nb$_{2/3}$O$_3$—PbTiO$_3$—PbZrO$_3$ ternary system solid solution composition.

23. The piezoelectric/electrostrictive porcelain composition according to claim 17, wherein a composition of the ZnO—PbO—B$_2$O$_3$-based glass is represented by the following composition formula (4):

$$d \text{ mass \% ZnO-}e \text{ mass \% PbO-}f \text{ mass \% B}_2\text{O}_3 \quad (4),$$

wherein $30 \leq d \leq 70$, $15 \leq e \leq 45$, $10 \leq f \leq 30$.

24. The piezoelectric/electrostrictive porcelain composition according to claim 17, wherein a raw material of the piezoelectric/electrostrictive component comprises particles, and wherein at least a part of surfaces of the particles are coated with the glass component.

25. The piezoelectric/electrostrictive porcelain composition according to claim 17, wherein raw materials of both the piezoelectric/electrostrictive component and the glass component comprise particles, and an average particle diameter of the glass component is smaller than that of an average particle diameter of the piezoelectric/electrostrictive component.

26. A piezoelectric/electrostrictive ceramic comprising crystal grains comprising the piezoelectric/electrostrictive porcelain composition according to claim 17.

27. The piezoelectric/electrostrictive ceramic according to claim 26, wherein an average diameter of the crystal grains is in a range of 0.3 to 5 μm.

28. The piezoelectric/electrostrictive ceramic according to claim 26, wherein an entire shape of the piezoelectric/electrostrictive ceramic is a sheet shape.

29. A piezoelectric/electrostrictive film type device comprising:
- a ceramic substrate;
- a film-like piezoelectric/electrostrictive portion; and
- a film-like electrode electrically connected to the piezoelectric/electrostrictive portion;
- wherein the piezoelectric/electrostrictive portion is a piezoelectric/electrostrictive film-type device bonded onto the substrate in one of a direct manner and an indirect manner via the electrode; and
- wherein the piezoelectric/electrostrictive portion comprising the piezoelectric/electrostrictive porcelain composition recited in claim 13.

30. The piezoelectric/electrostrictive film type device according to claim 29, wherein an average diameter of crystal grains of the piezoelectric/electrostrictive composition is in a range of 0.3 to 5 μm.

31. The piezoelectric/electrostrictive film type device according to claim 29, comprising a plurality of piezoelectric/electrostrictive portions and a plurality of electrodes, wherein the plurality of piezoelectric/electrostrictive portions are alternately laminated to be sandwiched by the plurality of electrodes.

32. The piezoelectric/electrostrictive film type device according to claim 29, wherein a thickness of the piezoelectric/electrostrictive portion is in a range of 0.5 to 50 μm.

* * * * *

UNITED STATES PATENT AND TRADEMARK OFFICE
CERTIFICATE OF CORRECTION

PATENT NO. : 7,309,949 B2  Page 1 of 1
APPLICATION NO. : 11/064070
DATED : December 18, 2007
INVENTOR(S) : Toshikatsu Kashiwaya, Yukihisa Takeuchi and Yuya Kikuta It is certified that error appears in the above-identified patent and that said Letters Patent is hereby corrected as shown below:

Column 22
    *Line 1*: please change "mainly composed" to --composed mainly--
    *Line 2*: please add --a-- after "of"
    *Line 6*: please change ";" to --:--
    *Line 12*: please change "0.250)" to --0.025)--
    *Line 14*: please change "0.475, 0.425)" to --0.525, 0.375)--
    *Line 16*: please change "1,000" to --1.000--

Column 23
    *Line 13*: please change "13" to --17--

Signed and Sealed this

Fifteenth Day of July, 2008

JON W. DUDAS
*Director of the United States Patent and Trademark Office*